United States Patent
Ritenour et al.

(10) Patent No.: US 9,142,620 B2
(45) Date of Patent: Sep. 22, 2015

(54) POWER DEVICE PACKAGING HAVING BACKMETALS COUPLE THE PLURALITY OF BOND PADS TO THE DIE BACKSIDE

(71) Applicant: RF Micro Devices, Inc., Greensboro, NC (US)

(72) Inventors: Andrew P. Ritenour, Colfax, NC (US); Paul Partyka, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/910,202

(22) Filed: Jun. 5, 2013

(65) Prior Publication Data
US 2014/0054597 A1    Feb. 27, 2014

Related U.S. Application Data

(60) Provisional application No. 61/693,040, filed on Aug. 24, 2012.

(51) Int. Cl.
*H01L 29/15*     (2006.01)
*H01L 29/66*     (2006.01)
*H01L 21/338*    (2006.01)
*H01L 21/20*     (2006.01)
*H01L 29/20*     (2006.01)
*H01L 21/02*     (2006.01)
(Continued)

(52) U.S. Cl.
CPC ........ *H01L 29/2003* (2013.01); *H01L 21/0254* (2013.01); *H01L 29/4175* (2013.01); *H01L 23/36* (2013.01); *H01L 2224/16* (2013.01); *H01L 2924/1305* (2013.01); *H01L 2924/13055* (2013.01); *H01L 2924/13062* (2013.01)

(58) Field of Classification Search
CPC ............ H01L 21/0254; H01L 29/2003; H01L 29/4175; H01L 23/36; H01L 2224/16
USPC ............. 257/76, 194, 782; 438/478, 172, 108
See application file for complete search history.

(56) References Cited

U.S. PATENT DOCUMENTS 4,317,055 A    2/1982    Yoshida et al.
4,540,954 A    9/1985    Apel
(Continued)

FOREIGN PATENT DOCUMENTS

EP    1187229 A1    3/2002
EP    1826041 A1    8/2007
(Continued)

OTHER PUBLICATIONS

International Search Report and Written Opinion for PCT/US2013/056105, mailed Feb. 12, 2014, 15 pages.
(Continued)

*Primary Examiner* — Long K Tran
*Assistant Examiner* — Dzung Tran
(74) *Attorney, Agent, or Firm* — Withrow & Terranova, P.L.L.C.

(57) ABSTRACT

The present disclosure provides a power device and power device packaging. Generally, the power device of the present disclosure includes a die backside and a die frontside. A semi-insulating substrate with epitaxial layers disposed thereon is sandwiched between the die backside and the die frontside. Pads on the die frontside are coupled to the die backside with patterned backmetals that are disposed within vias that pass through the semi-insulating substrate and epitaxial layers from the die backside to the die frontside.

19 Claims, 3 Drawing Sheets

(51) Int. Cl.
*H01L 29/417* (2006.01)
*H01L 23/36* (2006.01)

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A * | 9/1999 | Nishi et al. .................. 257/728 |
| 6,049,250 A | 4/2000 | Kintis et al. |
| 6,064,082 A | 5/2000 | Kawai et al. |
| 6,110,757 A | 8/2000 | Udagawa et al. |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 | 10/2003 | Andrys et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,405,068 B2 | 3/2013 | O'Keefe |
| 8,502,258 B2 | 8/2013 | O'Keefe |
| 8,633,518 B2 | 1/2014 | Suh et al. |
| 8,692,294 B2 | 4/2014 | Chu et al. |
| 8,785,976 B2 | 7/2014 | Nakajima et al. |
| 2001/0040246 A1 | 11/2001 | Ishii |
| 2001/0054848 A1 | 12/2001 | Baudelot et al. |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 * | 7/2004 | Mishra et al. .................. 257/778 |
| 2004/0241916 A1 | 12/2004 | Chau et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2006/0043385 A1 | 3/2006 | Wang et al. |
| 2006/0068601 A1 | 3/2006 | Lee et al. |
| 2006/0124960 A1 * | 6/2006 | Hirose et al. .................. 257/189 |
| 2006/0243988 A1 | 11/2006 | Narukawa et al. |
| 2007/0093009 A1 | 4/2007 | Baptist et al. |
| 2007/0295985 A1 | 12/2007 | Weeks, Jr. et al. |
| 2008/0023706 A1 | 1/2008 | Saito et al. |
| 2008/0073752 A1 * | 3/2008 | Asai et al. .................. 257/615 |
| 2008/0112448 A1 | 5/2008 | Ueda et al. |
| 2008/0121875 A1 | 5/2008 | Kim |

(56) References Cited

U.S. PATENT DOCUMENTS

| | | | |
|---|---|---|---|
| 2008/0142837 A1 | 6/2008 | Sato et al. | |
| 2008/0179737 A1 | 7/2008 | Haga et al. | |
| 2008/0190355 A1 | 8/2008 | Chen et al. | |
| 2008/0272382 A1 | 11/2008 | Kim et al. | |
| 2008/0272422 A1 | 11/2008 | Min | |
| 2008/0283821 A1 | 11/2008 | Park et al. | |
| 2008/0308813 A1 | 12/2008 | Suh et al. | |
| 2009/0072269 A1 | 3/2009 | Suh et al. | |
| 2009/0090984 A1 | 4/2009 | Khan et al. | |
| 2009/0146185 A1* | 6/2009 | Suh et al. | 257/194 |
| 2009/0146186 A1 | 6/2009 | Kub et al. | |
| 2009/0166677 A1 | 7/2009 | Shibata et al. | |
| 2009/0278137 A1 | 11/2009 | Sheridan et al. | |
| 2010/0025657 A1 | 2/2010 | Nagahama et al. | |
| 2010/0133567 A1 | 6/2010 | Son | |
| 2010/0187575 A1 | 7/2010 | Baumgartner et al. | |
| 2010/0207164 A1 | 8/2010 | Shibata et al. | |
| 2010/0230656 A1 | 9/2010 | O'Keefe | |
| 2010/0230717 A1 | 9/2010 | Saito | |
| 2010/0258898 A1 | 10/2010 | Lahreche | |
| 2011/0017972 A1 | 1/2011 | O'Keefe | |
| 2011/0025422 A1 | 2/2011 | Marra et al. | |
| 2011/0095337 A1 | 4/2011 | Sato | |
| 2011/0101300 A1 | 5/2011 | O'Keefe | |
| 2011/0115025 A1 | 5/2011 | Okamoto | |
| 2011/0127586 A1* | 6/2011 | Bobde et al. | 257/262 |
| 2011/0163342 A1 | 7/2011 | Kim et al. | |
| 2011/0175142 A1* | 7/2011 | Tsurumi et al. | 257/192 |
| 2011/0199148 A1 | 8/2011 | Iwamura | |
| 2011/0211289 A1 | 9/2011 | Kosowsky et al. | |
| 2011/0242921 A1 | 10/2011 | Tran et al. | |
| 2011/0290174 A1 | 12/2011 | Leonard et al. | |
| 2012/0018735 A1 | 1/2012 | Ishii | |
| 2012/0086497 A1 | 4/2012 | Vorhaus | |
| 2012/0126240 A1* | 5/2012 | Won | 257/76 |
| 2012/0199875 A1 | 8/2012 | Bhalla et al. | |
| 2012/0211802 A1 | 8/2012 | Tamari | |
| 2012/0218783 A1 | 8/2012 | Imada | |
| 2012/0262220 A1 | 10/2012 | Springett | |
| 2013/0277687 A1 | 10/2013 | Kobayashi et al. | |
| 2013/0280877 A1 | 10/2013 | Kobayashi et al. | |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Non-Final Office Action for U.S. Appl. No. 13/927,182, mailed May 1, 2014, 7 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.
Chao, C-H., et al., "Theoretical demonstration of enhancement of light extraction of flip-chip GaN light-emitting diodes with photonic crystals," Applied Physics Letters, vol. 89, 2006, 4 pages.
Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.
Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.
Hibbard, D.L. et al., "Low Resistance High Reflectance Contacts to p—GaN Using Oxidized Ni/Au and Al or Ag," Applied Physics Letters, vol. 83 No. 2, Jul. 14, 2003, pp. 311-313.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN—GaN light-emitting diodes," Applied Physics Letters, vol. 89, 071109, Aug. 2006, 4 pages.
Wierer, J. et al., "High-power AlGaInN flip-chip light-emitting diodes," Applied Physics Letters, vol. 78 No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Advisory Action for U.S. Appl. No. 10/620,205, mailed Feb. 15, 2005, 2 pages.
Final Office Action for U.S. Appl. No. 10/620,205, mailed Dec. 16, 2004, 9 pages.
Non-Final Office Action for U.S. Appl. No. 10/620,205, mailed Jul. 23, 2004, 7 pages.
Non-Final Office Action for U.S. Appl. No. 10/620,205, mailed May 3, 2005, 10 pages.
Notice of Allowance for U.S. Appl. No. 10/620,205, mailed Dec. 8, 2005, 4 pages.
Non-Final Office Action for U.S. Appl. No. 10/689,980, mailed Jan. 26, 2005, 7 pages.
Non-Final Office Action for U.S. Appl. No. 10/689,980, mailed May 12, 2005, 8 pages.
Non-Final Office Action for U.S. Appl. No. 12/841,225 mailed Dec. 22, 2011, 8 pages.
Non-Final Office Action for U.S. Appl. No. 11/397,279, mailed Oct. 31, 2007, 7 pages.
Notice of Allowance for U.S. Appl. No. 11/397,279, mailed Apr. 17, 2008, 7 pages.
Final Office Action for U.S. Appl. No. 10/689,979, mailed Jun. 29, 2005, 16 pages.
Non-Final Office Action for U.S. Appl. No. 10/689,979, mailed Jan. 11, 2005, 14 pages.
Notice of Allowance for U.S. Appl. No. 10/689,979, mailed Oct. 26, 2005, 6 pages.
Notice of Allowance for U.S. Appl. No. 12/841,225, mailed Nov. 9, 2012, 5 pages.
Non-Final Office Action for U.S. Appl. No. 11/360,734, mailed Jan. 18, 2008, 10 pages.
Notice of Allowance for U.S. Appl. No. 11/360,734, mailed Aug. 7, 2008, 6 pages.
Non-Final Office Action for U.S. Appl. No. 12/841,257 mailed Jan. 5, 2012, 13 pages.
Advisory Action for U.S. Appl. No. 11/937,207, mailed Feb. 2, 2010, 2 pages.
Final Office Action for U.S. Appl. No. 11/937,207, mailed Nov. 19, 2009, 9 pages.
Non-Final Office Action for U.S. Appl. No. 11/937,207, mailed Mar. 18, 2010, 10 pages.
Non-Final Office Action for U.S. Appl. No. 11/937,207, mailed May 29, 2009, 11 pages.
Notice of Allowance for U.S. Appl. No. 11/937,207, mailed Feb. 28, 2011, 8 pages.
Quayle Action for U.S. Appl. No. 11/937,207, mailed Nov. 24, 2010, 4 pages.
Final Office Action for U.S. Appl. No. 11/458,833, mailed Dec. 15, 2008, 13 pages.
Non-Final Office Action for U.S. Appl. No. 11/458,833, mailed Apr. 1, 2008, 10 pages.

(56) References Cited

OTHER PUBLICATIONS

Notice of Allowance for U.S. Appl. No. 11/458,833, mailed Mar. 9, 2009, 7 pages.
Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Notice of Allowance for U.S. Appl. No. 13/914,060, mailed Nov. 13, 2014, 8 pages.
Final Office Action for U.S. Appl. No. 13/966,400, mailed Dec. 3, 2014, 8 pages.
Final Office Action for U.S. Appl. No. 13/795,986, mailed Dec. 5, 2014, 16 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Notice of Allowance for U.S. Appl. No. 13/974,488, mailed May 29, 2015, 9 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/973,482, mailed May 4, 2015, 7 pages.
Notice of Allowance for U.S. Appl. No. 13/957,698, mailed Jul. 20, 2015, 7 pages.

* cited by examiner

POWER DEVICE PACKAGING HAVING BACKMETALS COUPLE THE PLURALITY OF BOND PADS TO THE DIE BACKSIDE

RELATED APPLICATIONS

This application claims the benefit of U.S. provisional patent application No. 61/693,040, filed Aug. 24, 2012, the disclosure of which is incorporated herein by reference in its entirety.

FIELD OF THE DISCLOSURE

The present disclosure relates to a power device and packaging thereof and in particular to gallium nitride (GaN) power devices along with their packaging.

BACKGROUND

The packaging of power devices is critical to device and system performance. Low resistance and low inductance connections are desirable for device terminals such as the source and drain terminals of a transistor or the anode and cathode terminals of a diode.

FIG. 1 depicts a cross-section view of a prior art high-voltage transistor 10 having a vertical structure with an unpatterned backside metallization that serves as a drain pad 12. Examples of such vertical devices include double-diffused metal oxide semiconductor (DMOS) transistors, insulated gate bipolar transistors (IGBTs), and junction field effect transistors (JFETs). These devices include a die 14 with a substrate 16 and an epitaxial layer 18 that are conductive. As a result, a through wafer via is not required. Moreover, a die attach process is provided with a large area, low resistance, and high current connection to the drain pad 12. Further still, a gate bond pad 20 and a source bond pad 22 are located on a frontside 24. A gate current is typically much less than a source current. Thus, the majority of the frontside 24 is usable for the source bond pad 22. A resulting large pad area available to the source bond pad 22 enables a low-cost, high current connection using large diameter wires, ribbons, or clips. A further advantage of the large pad area is that only a few large area bonds to the source bond pad 22 are required to carry a maximum device current. Another advantage is that the die 14 is also in good thermal contact with the substrate, which assists with heat dissipation.

In contrast to vertical power devices, gallium nitride (GaN) high electron mobility transistors (HEMTs) are lateral devices. As shown in FIG. 2 depicting a bond pad layout for a GaN device 26, GaN HEMTs can have a first gate pad 28, a second gate pad 30 along with both a source pad 32 and a drain pad 34 on a die front surface 36. To minimize die area, the source pad 32 and the drain pad 34 both have dimensions that are minimized. As a result of their minimized dimensions, the source pad 32 and the drain pad 34 of GaN HEMTs only provide enough space for small diameter bond wires such as source bond wires 38 and drain bond wires 40. A typical diameter for a bond wire using gold (Au) is about 25.4 μm (1 mil). As such, a typical 1200 V class GaN device in a standard TO-247 package can require between 20 and 30 bond wires on both the source pad 32 and the drain pad 34. Not only does this many bond wires add a significant packaging cost, but bond wires have significant inductance which can have a negative effect on the switching characteristics of the GaN device 26. Larger diameter bond wires, ribbons, or clips typically require a relatively large landing area that undesirably and significantly increases total die area of the GaN device 26. Another packaging option is a flip-chip process that attaches a die to a substrate using metallic bumps that are fabricated onto bond pads. However, in this case, the die is in poor thermal contact with the substrate, which results in a high thermal resistance and poor performance at elevated temperature. What is needed is an alternative structure for GaN devices such as transistors and diodes that reduces the cost and complexity of die assembly without introducing the aforementioned problems.

SUMMARY

The present disclosure relates to a power device and power device packaging. Generally, the power device of the present disclosure includes a die backside and a die frontside. A semi-insulating substrate with epitaxial layers disposed thereon is sandwiched between the die backside and the die frontside. Bond pads on the die frontside are coupled to the die backside with patterned backmetals that are disposed within vias that pass through the semi-insulating substrate and epitaxial layers from the die backside to the die frontside.

One embodiment includes a power module substrate adhered to the die backside. The power module substrate has an isolation region that electrically isolates patterned backmetals from each other.

Another embodiment has a thermal shunt that is fabricated within the power module substrate between isolation regions. The thermal shunt conducts heat away from the semi-insulating substrate, and in turn away from the epitaxial layers.

Yet another embodiment includes additional circuit element(s) coupled between the patterned backside metals. The additional circuit element(s) can be passive circuit elements or active circuit elements. The additional circuit element(s) can also be limiters and/or protectors for limiting current and overvoltage surges.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the term high resistivity and the term semi-insulating are used interchangeably throughout the disclosure. It is also to be understood that semi-insulating means electrically semi-insulating.

Figure 1:
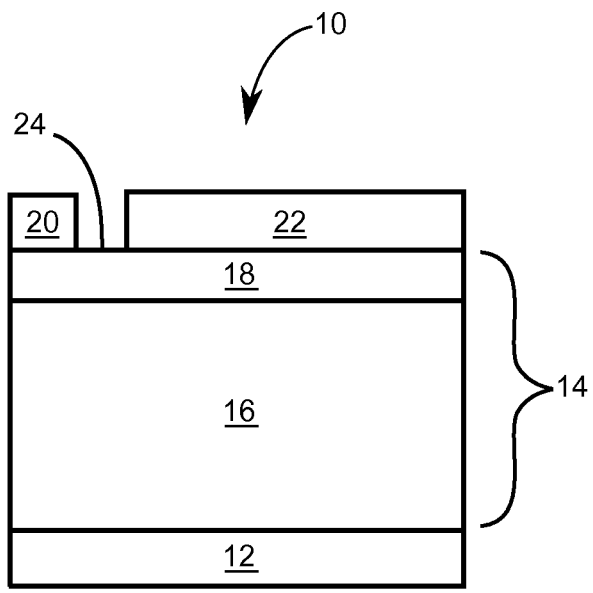
FIG. 1 is a cross-section view depicting a bond pad configuration for a prior art power transistor.
Figure 2:
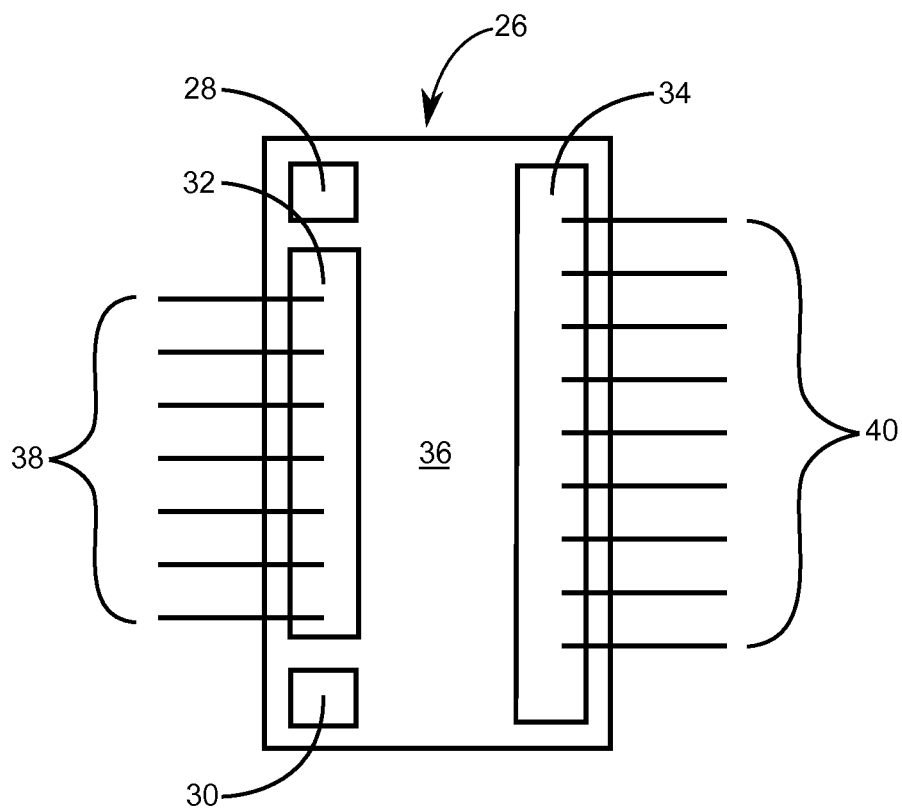
FIG. 2 is a plan view of a prior art bond pad layout for gallium nitride GaN high electron mobility transistors (HEMTs).
Figure 3:
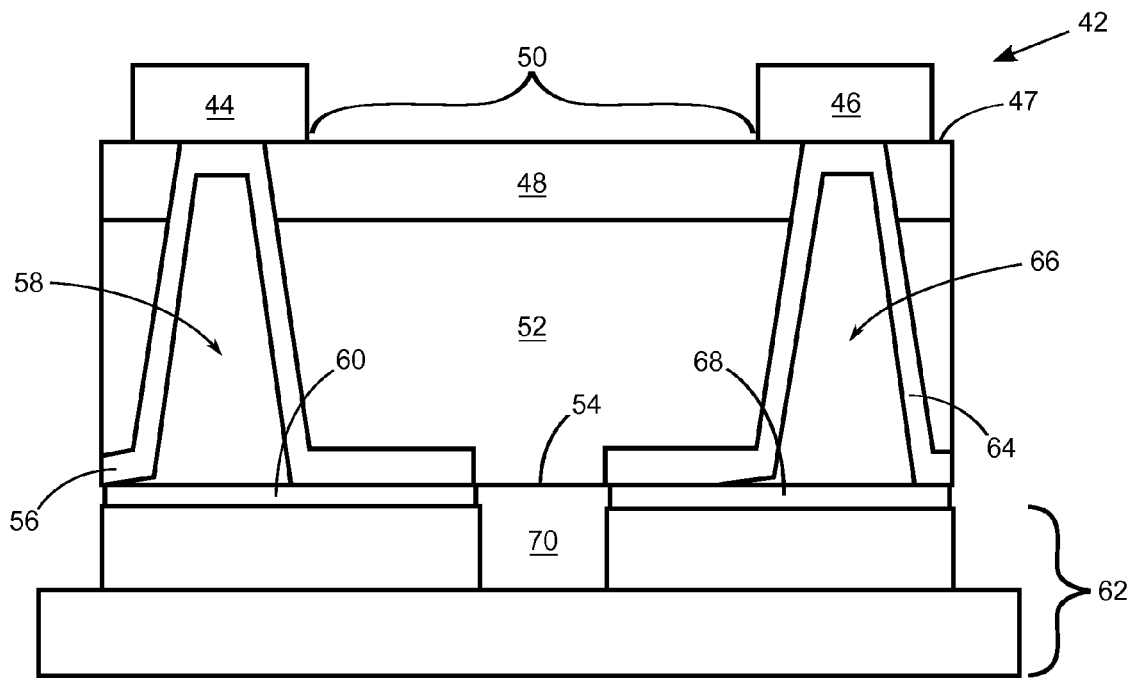
FIG. 3 is a cross-section view of an exemplary GaN device depicting source and drain connections on a backside of a die in accordance with the present disclosure.
Figure 4:
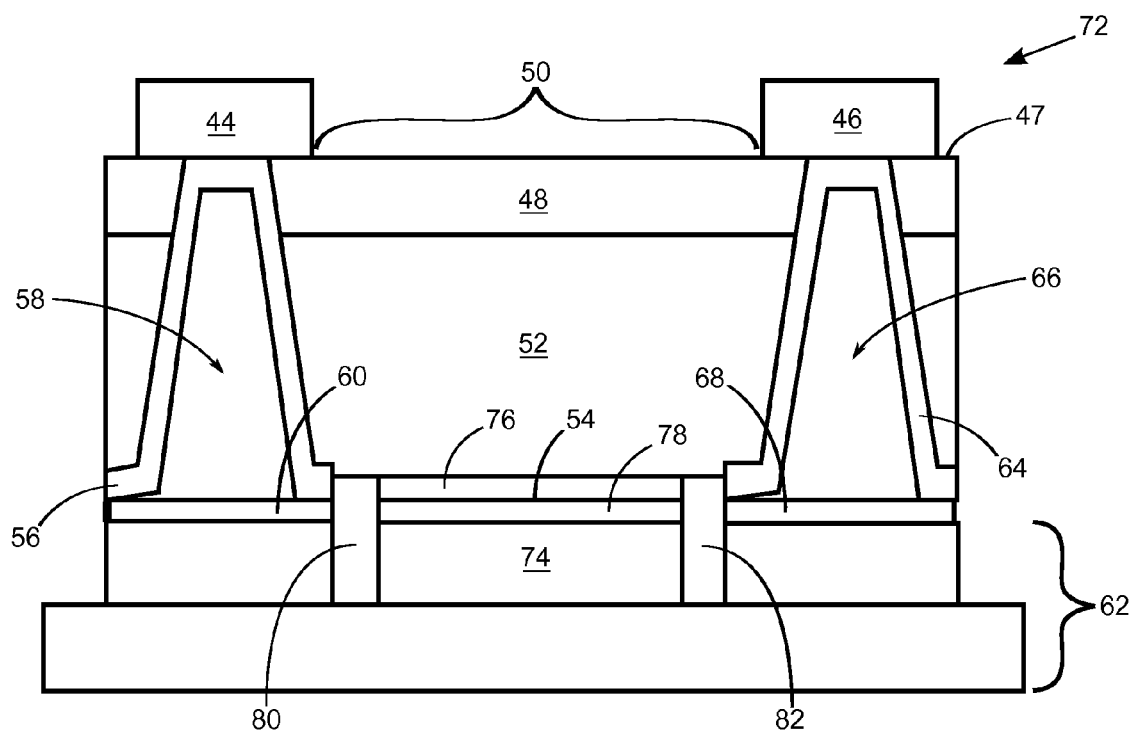
FIG. 4 is a cross-section view of the exemplary GaN device depicting a thermal shunt in addition to the source and drain connections.
Figure 5:
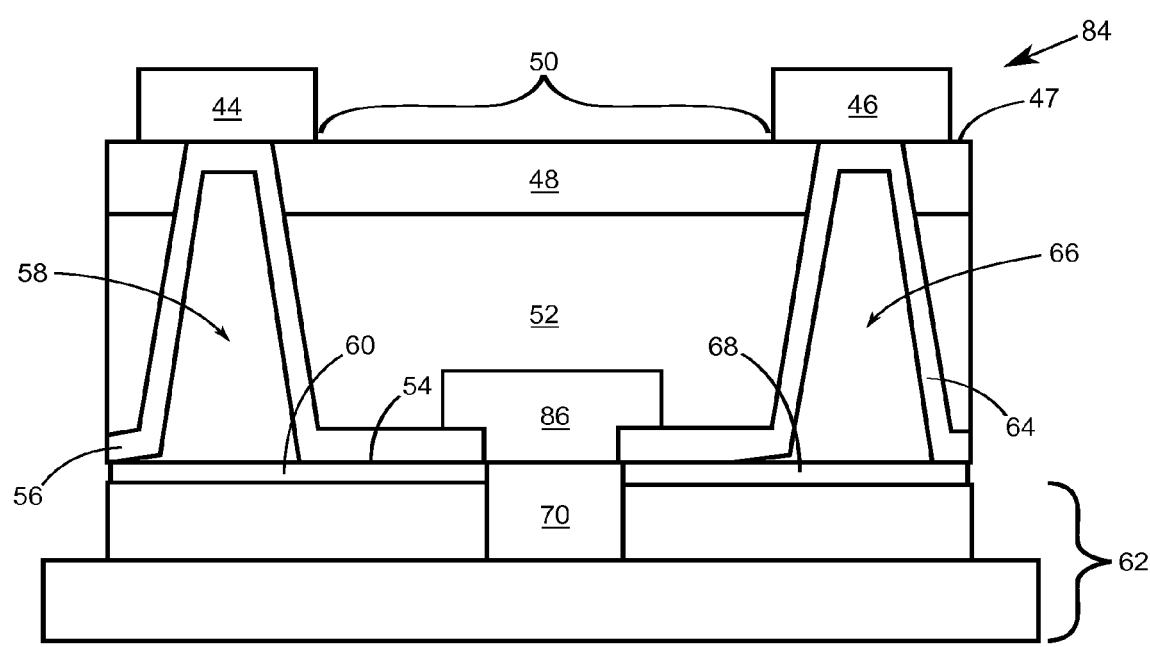
FIG. 5 is a cross-section view of the exemplary GaN device depicting an additional circuit element coupled between the drain, source, and/or gate.

FIGS. 3 through 5 depict alternative structures for GaN devices such as transistors and diodes that reduce the cost and complexity of die assembly without introducing the aforementioned problems. Beginning with FIG. 3, a GaN device 42 includes a source pad 44 and a drain pad 46 disposed onto a die frontside 47 that includes GaN epitaxial layers 48. A device active area 50 is located between the source pad 44 and the drain pad 46. A semi-insulating substrate 52 supports the GaN epitaxial layers 48. The semi-insulating substrate 52 has a bulk resistivity that ranges from around about $10^7$ Ohm-cm to around about $10^{12}$ Ohm-cm.

A die backside 54 includes a first patterned backmetal 56 that is disposed within a source backside via 58. The first patterned backmetal 56 couples the source pad 44 to a first die attach region 60 that adheres a power module substrate 62 to the die backside 54. The die backside 54 also includes a second patterned backmetal 64 that is disposed within a drain backside via 66. The second patterned backmetal 64 couples the drain pad 46 to a second die attach region 68 that adheres the power module substrate 62 to the die backside 54. An isolation region 70 provides electrical isolation between the first patterned backmetal 56 and the second patterned backmetal 64.

FIG. 4 is a cross-section view of another embodiment of the present disclosure, wherein a GaN device 72 includes a thermal shunt 74 located within the power module substrate 62 and under the device active area 50 for shunting heat away from the semi-insulating substrate 52. A third patterned backmetal 76 is disposed onto a third die attach region 78, which in turn is disposed onto the thermal shunt 74. A first isolation region 80 and a second isolation region 82 electrically isolate the third patterned backmetal 76, the third die attach region 78, and the thermal shunt 74 from the first patterned backmetal 56 and the second patterned backmetal 64.

FIG. 5 is a cross-section view of another embodiment of the present disclosure, wherein a GaN device 84 includes at least one circuit element 86 that is coupled between the source pad 44 and the drain pad 46 by a direct coupling of the circuit element 86 to the first patterned backmetal 56 and the second patterned backmetal 64. Exemplary types of circuit elements for circuit element 86 include transistors, diodes, resistors, capacitors, and inductors. The circuit element 86 can also be a limiter or protector for preventing damage to the GaN device 84 due to overcurrent, overvoltage, and surge voltage and/or surge current. The circuit element 86 can also be coupled between either the first patterned backmetal 56 or the second patterned backmetal 64 to a feature such as a gate pad (not shown). Moreover, it is to be understood that the circuit element 86 can be also be coupled to other features of the GaN device 84 using other patterned backmetal features like the first patterned backmetal 56 and the second patterned backmetal 64.

Those skilled in the art will recognize improvements and modifications to the embodiments of the present disclosure. All such improvements and modifications are considered within the scope of the concepts disclosed herein and the claims that follow.

What is claimed is:

1. A power device with packaging comprising:
a die frontside;
plurality of bond pads disposed on the die frontside;
a die backside;
a semi-insulating substrate with at least one gallium nitride (GaN) epitaxial layer disposed thereon being sandwiched between the die frontside and the die backside; and
patterned backmetals disposed within vias that pass through the semi-insulating substrate and the at least one GaN epitaxial layer from the die backside to the die frontside, wherein substantial portions of the patterned backmetals extend directly along the die backside externally from the vias to couple the plurality of bond pads to the die backside.

2. The power device with packaging of claim 1 further including a power module substrate adhered to the die backside.

3. The power device with packaging of claim 2 further including an isolation region that provides electrical isolation between the patterned backmetals.

4. The power device with packaging of claim 2 further including a thermal shunt fabricated within the power module substrate for shunting heat away from the semi-insulating substrate.

5. The power device with packaging of claim 2 further including a circuit element that couples between select ones of the plurality of bond pads.

6. The power device with packaging of claim 5 wherein the circuit element is a passive device.

7. The power device with packaging of claim 5 wherein the circuit element is an active device.

8. The power device with packaging of claim 5 wherein the circuit element is a current limiter.

9. The power device with packaging of claim 5 wherein the circuit element is an overvoltage protector.

10. A method of fabricating a power device with packaging comprising:
providing a semi-insulating substrate with at least one GaN epitaxial layer disposed thereon and sandwiched between a die frontside and a die backside;
fabricating a plurality of bond pads on the die frontside;

fabricating vias through the semi-insulating substrate and the at least one GaN epitaxial layer to create an open path between the die backside to the die frontside beneath the plurality of bond pads; and disposing patterned backmetals within the vias such that substantial portions of the patterned backmetals extend directly along the die backside externally from the vias to couple the plurality of bond pads to the die backside.

11. The method of claim 10 further including adhering a power module substrate to the die backside.

12. The method of claim 11 wherein the power module substrate includes an isolation region that provides electrical isolation between the patterned backmetals.

13. The method of claim 11 wherein a thermal shunt is fabricated within the power module substrate for shunting heat away from the semi-insulating substrate.

14. The method of claim 11 further including coupling a circuit element between select ones of the plurality of bond pads.

15. The method of claim 14 wherein the circuit element is a passive device.

16. The method of claim 14 wherein the circuit element is an active device.

17. The method of claim 14 wherein the circuit element is a current limiter.

18. The method of claim 14 wherein the circuit element is an overvoltage protector.

19. The power device of claim 1 wherein the GaN epitaxial layer is configured to realize a 1200 V class power device.

* * * * *